United States Patent
Usui et al.

(10) Patent No.: US 7,339,281 B2
(45) Date of Patent: Mar. 4, 2008

(54) CIRCUIT DEVICE AND MANUFACTURING METHOD THEREOF

(75) Inventors: Ryosuke Usui, Aichi (JP); Hiroyuki Watanabe, Aichi (JP); Takeshi Nakamura, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 436 days.

(21) Appl. No.: 11/139,210

(22) Filed: May 26, 2005

(65) Prior Publication Data

US 2005/0263895 A1    Dec. 1, 2005

(30) Foreign Application Priority Data

May 31, 2004  (JP) .......................... P2004-162657

(51) Int. Cl.
*H01L 23/29* (2006.01)

(52) U.S. Cl. .................... 257/795; 257/789; 438/118

(58) Field of Classification Search ................ 257/784, 257/758, 783, 782, 787, 789, 790, 795; 438/118, 438/119, 126, 127

See application file for complete search history.

(56) References Cited

U.S. PATENT DOCUMENTS

| | | | | |
|---|---|---|---|---|
| 3,649,354 A | * | 3/1972 | Te Velde | 438/107 |
| 5,981,313 A | * | 11/1999 | Tanaka | 438/118 |
| 6,404,062 B1 | * | 6/2002 | Taniguchi et al. | 257/778 |
| 2002/0060339 A1 | * | 5/2002 | Maruoka | 257/330 |
| 2003/0215056 A1 | * | 11/2003 | Vuorela | 378/62 |
| 2004/0164385 A1 | * | 8/2004 | Kado et al. | 257/678 |
| 2005/0023634 A1 | * | 2/2005 | Yoon et al. | 257/506 |
| 2006/0270112 A1 | * | 11/2006 | Chao et al. | 438/109 |
| 2007/0052089 A1 | * | 3/2007 | Kim et al. | 257/723 |

FOREIGN PATENT DOCUMENTS

JP       06-177295       6/1994

* cited by examiner

*Primary Examiner*—S. V. Clark
(74) *Attorney, Agent, or Firm*—Fish & Richardson P.C.

(57) ABSTRACT

A circuit device which enables easy formation of a connection part that connects wiring layers to each other, and a manufacturing method thereof are provided. In a method for manufacturing a hybrid integrated circuit device of the present invention, a first resin film is formed so as to cover a first wiring layer. Thereafter, a first through-hole is formed, which penetrates the first resin film and exposes the first wiring layer from a bottom thereof. Next, a second resin film is formed so as to fill up the first through-hole. Moreover, a second through-hole is formed in the second resin film buried in the first through-hole, and a connection part is formed.

16 Claims, 15 Drawing Sheets

CIRCUIT DEVICE AND MANUFACTURING METHOD THEREOF

BACKGROUND OF THE INVENTION

Priority is claimed to Japanese Patent Application No. JP2004-162657 filed on May 31, 2004, the disclosure of which is incorporated herein by reference in its entirety.

1. Field of the Invention

The present invention relates to a circuit device and a manufacturing method thereof, and more particularly relates to a circuit device including a plurality of wiring layers laminated with an insulating layer interposed therebetween, and a manufacturing method thereof.

2. Description of the Related Art

With reference to FIGS. 15A and 15B, a description will be given of a configuration of a conventional hybrid integrated circuit device 100. This technology is described for instance in Japanese Patent Application Publication No. Hei 6 (1994)-177295. FIG. 15A is a perspective view of the hybrid integrated circuit device 100, and FIG. 15B is a cross-sectional view along the line X-X' in FIG. 15A.

The conventional hybrid integrated circuit device 100 includes a rectangular substrate 106, and an insulating layer 107 provided on a surface of the substrate 106. On the insulating layer 107, a wiring layer 108 is patterned. Furthermore, a circuit element 104 is fixed on the wiring layer 108, and the circuit element 104 and the wiring layer 108 are electrically connected to each other by use of a thin metal wire 105. A lead 101 electrically connected to the wiring layer 108 is drawn out to the outside. Moreover, the entire hybrid integrated circuit device 100 is sealed with a sealing resin 102. As a method for sealing the device with the sealing resin 102, there are injection molding using a thermoplastic resin, and transfer molding using a thermosetting resin.

However, in the hybrid integrated circuit device 100 described above, formation of a single layer of wiring leads to a problem that limits a size of an electric circuit that can be integrated. As one of methods for solving this problem, there is a method for forming a multilayer structure of wirings laminated with an insulating layer interposed therebetween. To be more specific, a multilayer wiring structure is formed by laminating more than two wiring layers with an insulating layer interposed therebetween.

In order to form the multilayer wiring structure described above, it is required to form a connection part which penetrates the insulating layer and connects the respective wiring layers to each other. However, large amounts of inorganic fillers are mixed in the insulating layer for improvement in heat release properties. Therefore, if a through-hole is formed in the insulating layer by use of a laser, the inorganic fillers are exposed to a sidewall of the through-hole to form irregularities. Since it is difficult to form a plated film on the through-hole in such a state, there is a problem that it is not easy to form the connection part described above.

SUMMARY OF THE INVENTION

The present invention was made in consideration for the foregoing problems. The main object of the present invention is to provide a circuit device which enables easy formation of a connection part that connects wiring layers to each other, and a manufacturing method thereof.

A circuit device of the present invention includes: a plurality of wiring layers which are laminated with an insulating layer containing fillers interposed therebetween; and a connection part which penetrates the insulating layer in a thickness direction thereof, and electrically connects the wiring layers to each other in a desired spot. In the circuit device, the connection part is provided inside an insulating resin which covers a sidewall of a through-hole provided in the insulating layer. In addition, the insulating resin contains fewer fillers than the insulating layer.

Moreover, a circuit device of the present invention includes a plurality of wiring layers laminated with an insulating layer containing fillers interposed therebetween. In the circuit device, the wiring layers are electrically connected to each other in a desired spot through a connection part which penetrates the insulating layer in a thickness direction thereof. In addition, the insulating layer is formed of a first resin film containing fillers, and a second resin film which is laminated on the first resin film and contains fewer fillers than the first resin film. Moreover, a through-hole which penetrates the first resin film in a thickness direction thereof is provided, and the connection part is provided inside the second resin film which covers a sidewall of the through-hole.

A method for manufacturing a circuit device of the present invention is a method for laminating a plurality of wiring layers with an insulating layer containing fillers interposed therebetween, including forming a first through-hole which penetrates the insulating layer in a thickness direction thereof, burying an insulating resin, which contains fewer fillers than the insulating layer, in the first through-hole; forming a second through-hole, which has a planar size smaller than that of the first through-hole, in the insulating resin; and providing a connection part which connects the wiring layers to each other in the second through-hole.

Furthermore, a method for manufacturing a circuit device of the present invention includes forming a first wiring layer on a surface of a circuit board; providing a first resin film having fillers mixed therein on the surface of the circuit board so as to cover the first wiring layer; forming a first through-hole which penetrates the first resin film in a thickness direction thereof, and exposing the first wiring layer from a bottom of the first through-hole; forming a second resin film, which contains fewer fillers than the first resin film, on a surface of the first resin film so as to be buried in the first through-hole; laminating a second conductive film on a surface of the second resin film; forming a second through-hole smaller than the first through-hole by removing the second resin film buried in the first through-hole and the second conductive film thereabove, and exposing the first wiring layer from a bottom of the first through-hole; providing a connection part which connects the first wiring layer to the second conductive film in the second through-hole; and forming a second wiring layer by patterning the second conductive film.

According to the circuit device of the present invention, the sidewall of the through-hole is covered with the insulating resin or the second resin film, and the connection part which connects the plurality of wirings to each other is provided in the through-hole. Therefore, a stress is eased by the insulating resin or the second resin film, which contains fewer fillers, and connection reliability of the connection part can be improved.

According to the method for manufacturing a circuit device of the present invention, the insulating resin is buried in the first through-hole formed in the insulating layer, and the connection part is formed in the second through-hole which is newly formed in the insulating resin. Therefore, since the connection part is formed in the second throughhole containing fewer fillers, the connection part can be easily formed. The connection part can be formed by deposition of a plated film, and the like.

Furthermore, according to the method for manufacturing a circuit device of the present invention, the insulating layer is formed of the first resin film and the second resin film containing fewer fillers than the first resin film. In addition, the first through-hole is provided in the first resin film, and the second resin film is applied onto the surface of the first resin film so as to fill up the first through-hole. Moreover, the second through-hole is provided in the second resin film buried in the first through-hole, and the connection part is formed in the second through-hole. Therefore, since the second resin film contains fewer fillers, the through-holes can be easily formed.

DESCRIPTION OF THE EMBODIMENTS

First Embodiment

Figure 1A:
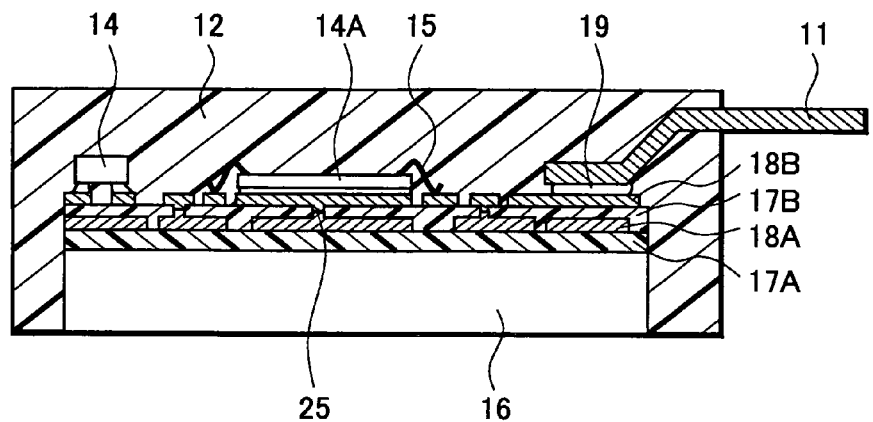
FIGS. 1A to 1C are cross-sectional views showing a hybrid integrated circuit device of the preferred embodiment of the invention.
Figure 1B:
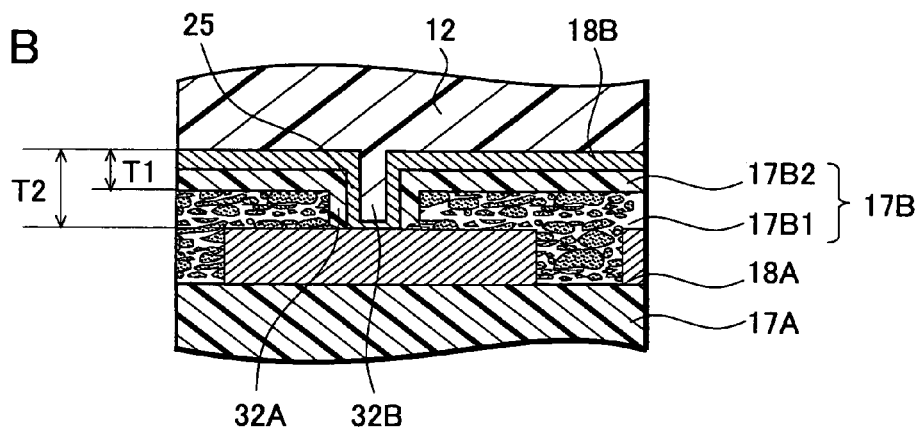
Figure 1C:
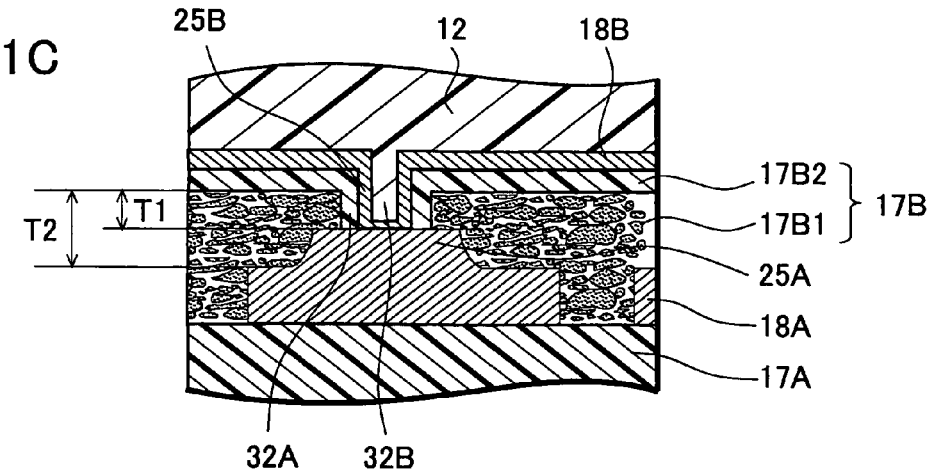

In this embodiment, as an example of a circuit device, a hybrid integrated circuit device as shown in FIGS. 1A to 1C and the like will be described. However, the embodiment described below is also applicable to other kinds of circuit devices.

With reference to FIGS. 1A to 1C, a configuration of a hybrid integrated circuit device 10 of the preferred embodiment of the invention will be described. FIG. 1A is a cross-sectional view of the hybrid integrated circuit device 10, and FIG. 1B is an enlarged cross-sectional view around a connection part 25. FIG. 1C is a cross-sectional view showing another configuration of the connection part 25.

In the hybrid integrated circuit device 10, with reference to FIG. 1A, an electric circuit including a wiring layer 18 and a circuit element 14 is formed on a surface of a circuit board 16 which functions as a supporting board. Moreover, the electric circuit formed on the surface of the circuit board 16 is sealed with a sealing resin 12. In a periphery of the circuit board 16, a lead 11 is fixed to an uppermost wiring layer 18, and an end of the lead 11 is extended to the outside of the sealing resin 12. In this embodiment, the wiring layer 18 has a multilayer wiring structure. Here, a two-layer wiring structure is realized, which includes a first wiring layer 18A and a second wiring layer 18B. The respective wiring layers 18 are laminated with insulating layers interposed therebetween. The hybrid integrated circuit device 10 having such a configuration will be described in detail below.

In terms of heat release, a board made of metal, ceramic or the like may be used as the circuit board 16. Moreover, for a material of the circuit board 16, Al, Cu, Fe or the like can be used as metal, and $Al_2O_3$ or AlN can be used as ceramic. Besides the above, a material excellent in mechanical strength or heat release properties can be used as the material of the circuit board 16. In this embodiment, a first insulating layer 17A is formed on the surface of the circuit board 16 made of aluminum, and the wiring layer 18 is formed thereon. In addition, in this embodiment, it is preferable to use metal mainly made of copper as the material of the circuit board 16. Since copper has an excellent thermal conductivity, the heat release properties of the entire device can be improved. Moreover, if Al is used as the material of the circuit board 16, an oxide film may be formed on the surface of the circuit board 16. Furthermore, if Al is used, aluminum oxide may be formed on the surface in consideration of the mechanical strength.

The first insulating layer 17A is formed on the surface of the circuit board 16 so as to substantially cover the entire surface. As the first insulating layer 17, a resin containing fillers can be used. Here, as the fillers, for example, aluminum compounds, calcium compounds, potassium compounds, magnesium compounds or silicon compounds can be used. Moreover, in order to improve the heat release properties of the entire device, the first insulating layer 17A contains more fillers than the other insulating layer, and a filler content is, for example, about 60% to 80%. Furthermore, the heat release properties can also be improved by mixing fillers having a large diameter of 50 μm or more in the first insulating layer 17A. A thickness of the first insulating layer 17A is changed depending on a required withstand voltage, and may be about 50 μm to several hundred μm.

The first wiring layer 18A is made of metal such as copper, and is patterned on the surface of the first insulating layer 17A. The first wiring layer 18A is electrically connected to the second wiring layer 18B thereabove, and mainly has a function of extending a pattern.

A second insulating layer 17B is formed on the surface of the circuit board 16 so as to cover the first wiring layer 18A. In the second insulating layer 17B, the connection part 25 which electrically connects the first wiring layer 18A to the second wiring layer 18B is formed so as to penetrate the second insulating layer 17B. Therefore, in order to facilitate formation of the connection part 25, the second insulating layer 17B may contain fewer fillers than the first insulating layer 17A. Furthermore, for the same reason, an average particle diameter of the fillers contained in the second insulating layer 17B may be smaller than that of the fillers contained in the first insulating layer 17A. In this embodiment, the second insulating layer 17B is formed of a first resin film 17B1 and a second resin film 17B2 formed thereon. Details thereof will be described later.

The second wiring layer 18B is formed on the surface of the second insulating layer 17B. The second wiring layer 18B forms pads on which the circuit elements 14 such as a semiconductor element 14A are mounted, a wiring part which connects the respective pads, a pad on which the lead 11 is fixed, and the like. Moreover, the second wiring layer 18B and the first wiring layer 18A can be formed so as to planarly intersect with each other. Therefore, even if the semiconductor element 14A has a number of electrodes, the pattern can be freely extended by use of the multilayer wiring structure of the present application. The second wiring layer 18B and the first wiring layer 18A described above are connected to each other in desired spots through the connection part 25.

The circuit element 14 is fixed onto the wiring layer 18B, and the circuit element 14 and the wiring layer 18 form a predetermined electric circuit. As the circuit element 14, an active element such as a transistor and a diode, or a passive element such as a condenser and a resistor is adopted. Moreover, an element with a large calorific value such as a power semiconductor element may be fixed to the circuit board 16 with a heat sink interposed therebetween, the heat sink being made of metal. Here, the active element which is mounted face up, or the like is electrically connected to the second wiring layer 18B through a thin metal wire 15.

The semiconductor element 14A is one having several dozen to several hundred pads on its surface. Moreover, a so-called system LSI can also be adopted as the semiconductor element 14A. Here, the system LSI means an element which has an analog computing circuit, a digital computing circuit, a storage part or the like, and realizes system functions in one LSI. Therefore, compared to a conventional LSI, the system LSI is operated with generation of a large amount of heat.

Moreover, if a rear surface of the semiconductor element 14A is connected to a ground potential, the rear surface thereof is fixed by use of a solder material, a conductive paste or the like. Moreover, if the rear surface of the semiconductor element 14A is in a floating state, the rear surface thereof is fixed by use of an insulating adhesive. Note that, if the semiconductor element 14A is mounted face down, the element is mounted by means of a bump electrode made of solder or the like.

Furthermore, as the semiconductor element 14A, a power transistor which controls a large current, for example, a power MOS, a GTBT, an IGBT, a thyristor, and the like can be adopted. Moreover, a power IC can also be adopted as the semiconductor element 14.

The lead 11 is fixed to the second wiring layer 18B in the periphery of the circuit board 16, and has a function of performing input/output from/to the outside, for example. Here, a number of the leads 11 are provided on one side. The leads 11 are attached to the pattern by use of a solder material 19 such as solder.

The sealing resin 12 is formed by transfer molding using a thermosetting resin or by injection molding using a thermoplastic resin. Here, the sealing resin 12 is formed so as to seal the circuit board 16 and the electric circuit formed on the surface thereof, and a rear surface of the circuit board 16 is exposed from the sealing resin 12. Moreover, a sealing method other than sealing by molding is also applicable to the hybrid integrated circuit device of this embodiment. For example, well-known sealing methods including sealing by resin potting, sealing by use of a case material, and the like can be applied. With reference to FIG. 1A, in order to suitably release heat to the outside, the heat being generated from the circuit element 14 mounted on the surface of the circuit board 16, the rear surface of the circuit board 16 is exposed to the outside of the sealing resin 12. Moreover, in order to improve moisture resistance of the entire device, it is also possible to seal the entire device including the rear surface of the circuit board 16 by use of the sealing resin 12.

With reference to FIG. 1B, in this embodiment, the second insulating layer 17B is formed of the first and second resin films 17B1 and 17B2. To be more specific, the first resin film 17B1 made of resin having inorganic fillers mixed therein is formed so as to cover the first wiring layer 18A. Moreover, the second resin film 17B2 is laminated on the first resin film 17B1. This configuration achieves an advantage that formation of the connection part 25 is facilitated. Details thereof will be described later.

Furthermore, with reference to FIG. 1B, the connection part 25 is a part which penetrates the second insulating layer 17B and electrically connects the first and second wiring layers 18A and 18B to each other. Here, the second resin film 17B2 is buried in a first through-hole 32A provided in the first resin film 17B1, and a second through-hole 32B is provided in the buried portion of the second resin film 17B2. In addition, the connection part 25 made of a plated film is formed on an inner wall of the second through-hole 32B.

In this embodiment, the second resin film 17B2 provided on an inner wall of the first through-hole 32A improves connection reliability of the connection part 25. Specifically, since metal that is the material of the connection part 25 has a thermal expansion coefficient different from that of the first resin film 17B1, thermal stress is caused therebetween when heated. Accordingly, in this embodiment, by interposing the second resin film 17B2 between the connection part 25 and the first resin film 17B1, the second through-hole 32B functions as a region to ease the stress. Thus, reduction in the thermal stress is realized. To be more specific, the second resin film 17B2 is buried in the first through-hole 32A provided in the first resin film 17B1. Thereafter, the second through-hole 32B is provided in the buried portion of the second resin film 17B2, and the connection part 25 that is the plated film is formed in the second through-hole 32B. Here, in the first through-hole 32A, the second resin film 17B2 covering the first resin film 17B1 is buried. However, an insulating resin may be partially buried only in the first through-hole 32A.

With reference to FIG. 1C, a configuration of another form of the connection part 25 will be described. Here, the connection part 25 is formed of a first connection part 25A extended from the first wiring layer 18A, and a second connection part 25B extended from the second wiring layer 18B. The first connection part 25A is a part protruded continuously from the first wiring layer 18A in its thickness direction. Here, the first connection part 25A is protruded upward and buried in the second insulating layer 17B. The second connection part 25B is a part protruded continuously from the second wiring layer 18B in its thickness direction. Here, the second connection part 25B is protruded downward and buried in the second insulating layer 17B.

The first connection part 25A is formed by etching processing so as to be protruded in the thickness direction, and is made of the same material as a rolled copper foil that is a material to form the wiring layers. Moreover, the first connection part 25A can also be formed by use of a method other than etching processing. To be more specific, by depositing an electrolytic plated film or an electroless plated film so as to form a convex shape on the surface of the first wiring layer 18A, the first connection part 25A can be formed. Moreover, it is also possible to form the first connection part 25A by providing a conductive material such as a solder material including solder and the like, and a silver paste on the surface of the first wiring layer 18A.

The second connection part 25B is a part formed by plating processing such as electrolytic plating and electroless plating. To be more specific, the second connection part 25B is formed of the plated film formed on the inner wall of the second through-hole 32B. A method for forming the second connection part 25B will be described later in an embodiment for explaining a manufacturing method.

In this embodiment, a spot where the above-described first and second connection parts 25A and 25B come into contact with each other is positioned in an intermediate portion of the second insulating layer 17B in its thickness direction. Here, the intermediate portion means a portion that is above an upper surface of the first wiring layer 18A and is below a lower surface of the second wiring layer 18B. Therefore, although the spot where the first and second connection parts 25A and 25B come into contact with each other is around a center portion of the second insulating layer 17B in its thickness direction on the page space, the spot can be changed within a range of the intermediate portion described above. Considering the case where the second connection part 25B is formed by plating processing, the portion where the first and second connection parts 25A and 25B come into contact with each other is above the center portion of the second insulating layer 17B in its thickness direction. Thus, there is an advantage that formation of the second connection part 25B made of the plated film is facilitated.

Figure 2:
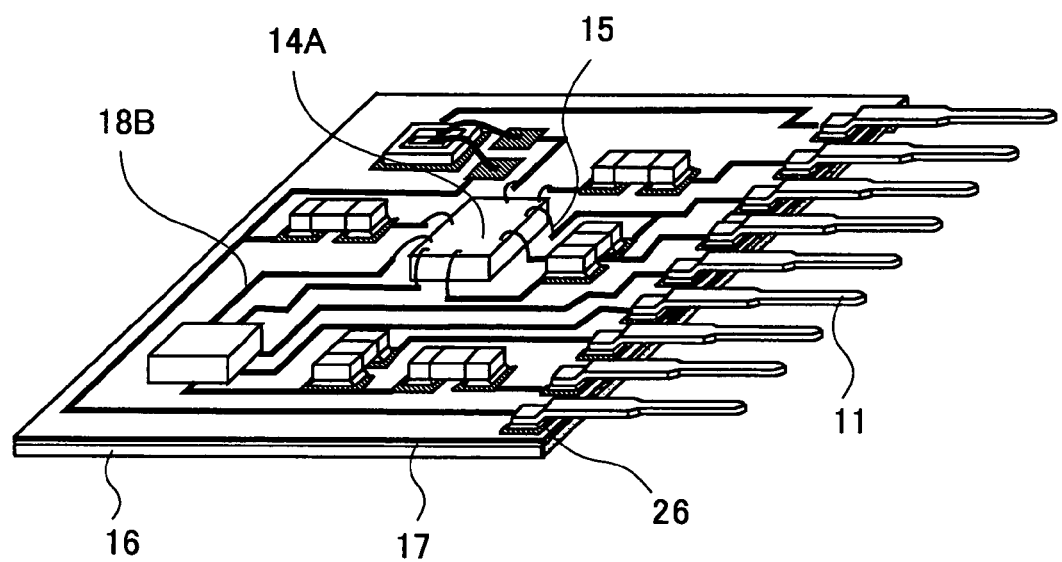
FIG. 2 is a perspective view showing the hybrid integrated circuit device of the preferred embodiment of the invention.

With reference to a perspective view of FIG. 2, a description will be given of an example of a specific shape of the second wiring layer 18B formed on the surface of the circuit board 16. In FIG. 2, the resin for sealing the entire device is omitted.

With reference to FIG. 2, the second wiring layer 18B forms bonding pads on which the circuit elements 14 are mounted, pads 26 to which the leads 11 are fixed, and the like. Moreover, around the semiconductor element 14A, a number of pads are formed, to which the thin metal wires 15 are wire-bonded. In the case where the semiconductor element 14A having a number of bonding pads is mounted, a wiring density is limited in a single layer pattern including only the second wiring layer 18B. Thus, the pattern may not be sufficiently extended. In this embodiment, by constructing a multilayer wiring structure on the surface of the circuit board 16, a complex pattern extension is realized.

Figure 3A:
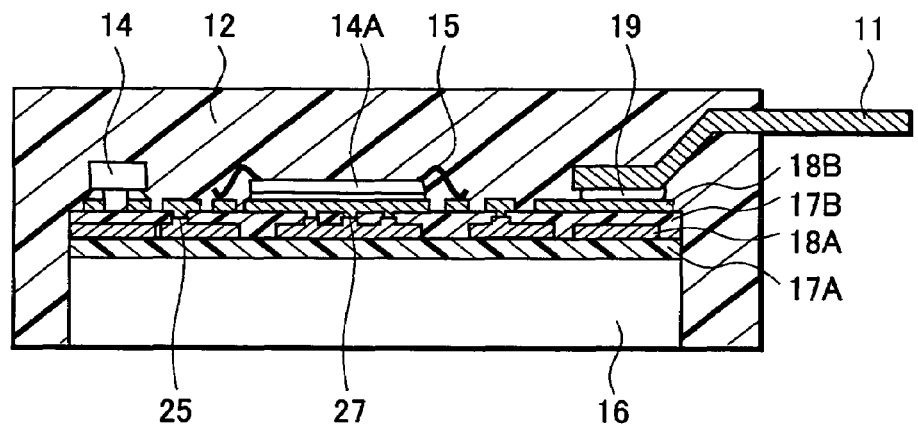
FIGS. 3A and 3B are cross-sectional views showing the hybrid integrated circuit device of the preferred embodiment of the invention.
Figure 3B:
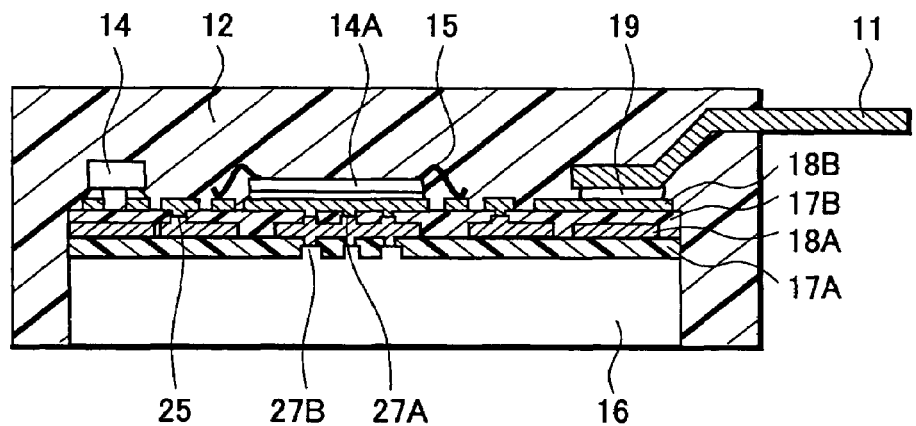

With reference to FIGS. 3A and 3B, a configuration of a hybrid integrated circuit device of another mode will be described. FIGS. 3A and 3B are cross-sectional views of the hybrid integrated circuit device of the other mode. In the hybrid integrated circuit device shown in FIGS. 3A and 3B, the second insulating layer 17B positioned between respective wiring layers is also formed of the first resin film 17B1 and the second resin film 17B2 formed thereon.

With reference to FIG. 3A, here, a thermal via 27 is formed so as to penetrate the second insulating layer 17B. The thermal via 27 is a part formed by filling a hole penetrating the second insulating layer 17B with metal, and functions as a path of heat to the outside. Therefore, the thermal via 27 may not be electrically connected. To be more specific, the thermal via 27 is formed so as to come into contact with a lower surface of the land-shaped second wiring layer 18B to which a semiconductor element 14A is fixed. Therefore, even if a large amount of heat is generated from the semiconductor element 14A, the heat is transmitted to the circuit board 16 through the plurality of thermal vias 27. In this case, a path of the heat is from the semiconductor element 14A to the outside through the second wiring layer 18B, the thermal via 27, the first insulating layer 17A, and the circuit board 16. Here, the thermal via 27 is formed of the first and second connection parts 25A and 25B described above. In addition, a portion where the first and second connection parts 25A and 25B come into contact with each other is an intermediate portion of the insulating layer in its thickness direction.

With reference to FIG. 3B, here, the thermal vias 27 are provided in both of the first insulating layer 17A and the second insulating layer 17B. As described above, the first insulating layer 17A containing a large amount of fillers has excellent heat release properties. Therefore, by providing a thermal via 27B in the first insulating layer 17A as shown in FIG. 3B, the heat release properties can be further improved. The thermal via 27B provided in the first insulating layer 17A may also be provided in a region corresponding to a lower side of the semiconductor element 14A which generates heat.

In the case where the thermal via 27B is formed between the circuit board 16 and the first insulating layer 17A as described above, a first connection part 25A protruded in a convex shape is formed on the surface of the circuit board 16. Moreover, a second connection part 25B is provided on a rear surface of the first wiring layer 18A. Accordingly, the first and second connection parts 25A and 25B are allowed to come into contact with each other in an intermediate portion of the first insulating layer 17A.

Figure 4A:
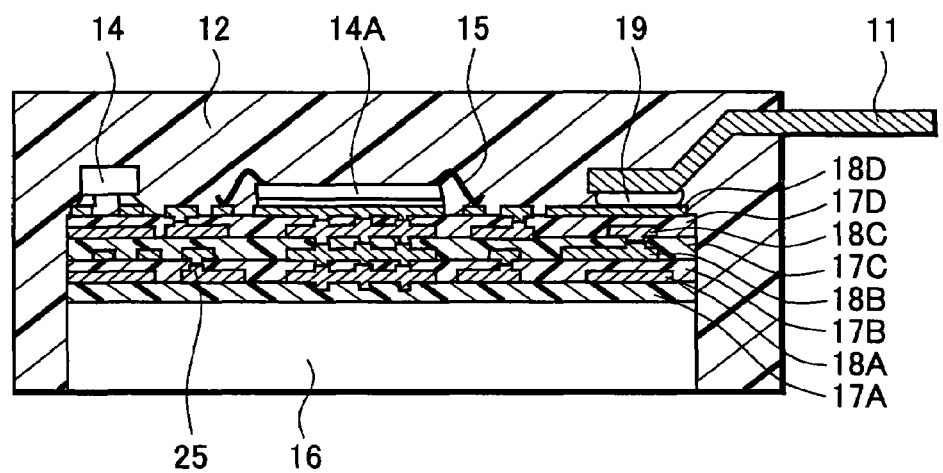
FIGS. 4A and 4B are cross-sectional views showing the hybrid integrated circuit device of the preferred embodiment of the invention.
Figure 4B:
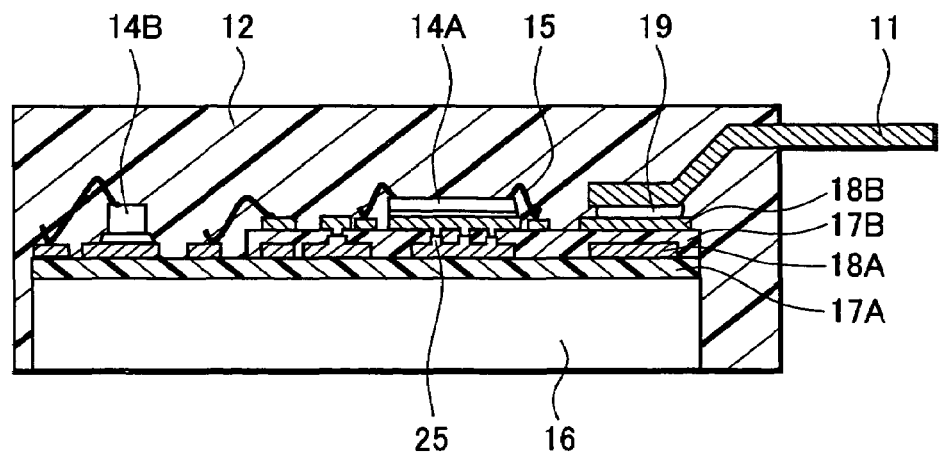

With reference to FIGS. 4A and 4B, a description will be given of structures of hybrid integrated circuit devices of still other modes. FIGS. 4A and 4B are cross-sectional views of the hybrid integrated circuit devices. In the hybrid integrated circuit devices shown in FIGS. 4A and 4B, the respective insulating layers 17 positioned between respective wiring layers are also formed of the first resin film 17B1 and the second resin film 17B2 formed thereon.

With reference to FIG. 4A, here, a four-layer wiring structure is formed by the laminating wiring layers 18 with the insulating layers 17 interposed therebetween. To be more specific, the first wiring layer 18A is formed on the first insulating layer 17A. Thereafter, second to fourth wiring layers 18B to 18D are laminated with the second to fourth insulating layers 17B to 17D interposed therebetween. As described above, by increasing the number of the wiring layers 18, a wiring density can be improved. In the second to fourth insulating layers 17B to 17D, the connection parts 25 are formed to connect the respective wiring layers to each other. Here, the second insulating layer 17B, the third insulating layer 17C, and the fourth insulating layer 17D are also formed of the first and second resin films 17B1 and 17B2 described above. Thus, there is an advantage that formation of the connection parts 25 is facilitated.

With reference to FIG. 4B, here, a multilayer wiring structure is formed on the surface of the circuit board 16 in a region where the semiconductor element 14A having a number of pads is mounted. Meanwhile, a single-layer wiring structure is formed on the surface of the circuit board 16 in a region where a circuit element 14B is fixed.

The semiconductor element 14A is an element having several dozen to several hundred electrodes as described above. Therefore, in order to extend a pattern which is connected to the electrodes of the semiconductor element 14A, the multilayer wiring structure is formed around the semiconductor element 14A. To be more specific, a multilayer wiring structure including the first and second wiring layers 18A and 18B is formed.

Moreover, the second wiring layer 18B formed to have a multilayer structure and the first wiring layer 18A formed to have a single-layer structure are electrically connected to each other through the thin metal wires 15.

The circuit element 14B is, for example, a power semiconductor element, and is a switching element which generates a large amount of heat. A region of the circuit board 16 where the single-layer wiring structure including the first wiring layer 18A is formed has a heat release effect larger than those of other regions. Therefore, a discrete transistor which has a large calorific value such as the circuit element 14B may be directly fixed to the first wiring layer 18A which forms the single-layer wiring.

Second Embodiment

In this embodiment, a description will be given of a method for manufacturing a hybrid integrated circuit device as an example of a circuit device. However, the following manufacturing method of this embodiment is also applicable to methods for manufacturing other types of circuit devices.

Figure 5A:
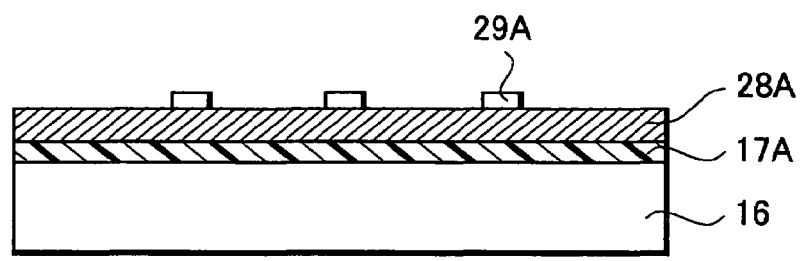
FIGS. 5A to 5C are cross-sectional views showing a method for manufacturing a hybrid integrated circuit device of the preferred embodiment of the invention.

First, with reference to FIG. 5A, a first insulating layer 17A is applied onto a surface of a circuit board 16, and a first conductive film 28A is laminated thereon. As the circuit board 16, a metal plate having a thickness of about 1.5 mm can be used. Moreover, as the first conductive film 28A, a material mainly made of copper or a material mainly made of Fe—Ni or Al can be used. For a thickness of the first conductive film 28A, not less than a thickness obtained by adding a thickness of a wiring layer 18A to be formed and a height of a first connection part 25A is required. To be more specific, the thickness of the first conductive film 28A is, for example, about 20 μm to 150 μm. A resist 29A covers a surface of the first conductive film 28A in a region where the first connection part 25A will be formed. In a state where the resist 29A covers the surface, etching is performed. Moreover, as the first insulating layer 17A, one obtained by mixing inorganic fillers in an insulating resin such as an epoxy resin can be used. Here, as the inorganic fillers to be mixed in, $SiO_2$, $Al_2O_3$, SiC, AlN, or the like can be used.

Figure 5B:
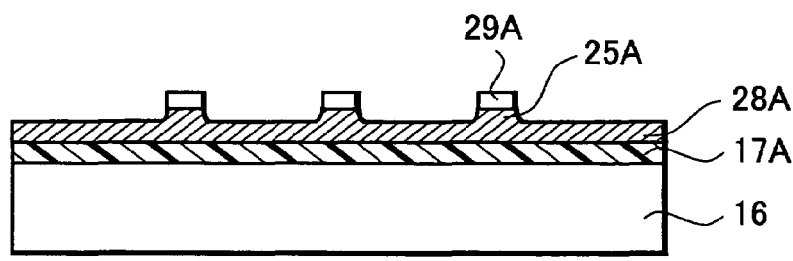
Figure 5C:
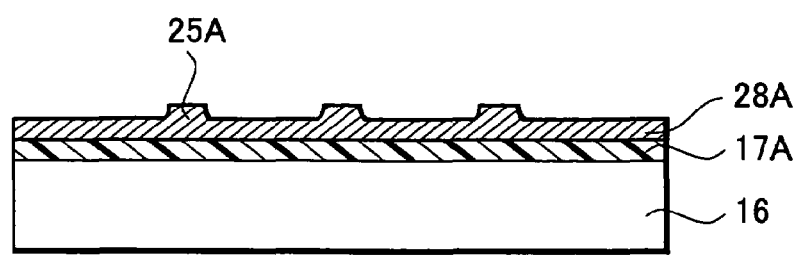

FIG. 5B shows a cross section in a state after etching is performed. Here, the region covered with the resist 29A is protruded in a convex shape. The portion protruded in the convex shape forms the first connection part 25A. The first conductive film 28A in the region where etching is performed with the surface exposed is formed to be uniformly thin. After this step is finished, the resist 29A is removed. Here, a height of protrusion of the first connection part 25A is adjusted to about several ten μm. FIG. 5C shows the first connection part 25A in the state where the resist 29A is removed.

By the step described above, the first connection part 25A is formed, which is protruded in the convex shape in the thickness direction of the first conductive film 28A. However, the circuit device can also be formed by omitting this step. For example, in the case where a connection part 25 having the configuration as shown in FIG. 1B is formed, the foregoing step can be omitted.

Figure 6A:
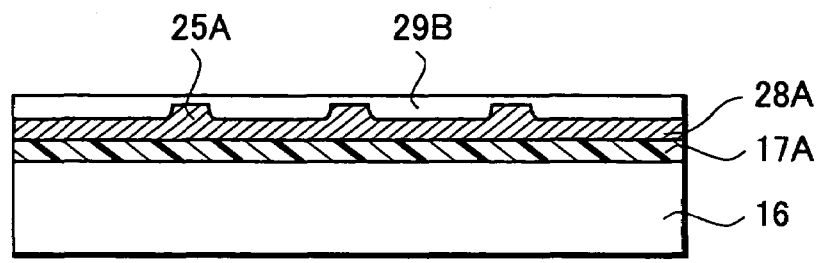
FIGS. 6A to 6C are cross-sectional views showing the method for manufacturing a hybrid integrated circuit device of the preferred embodiment of the invention.
Figure 6B:
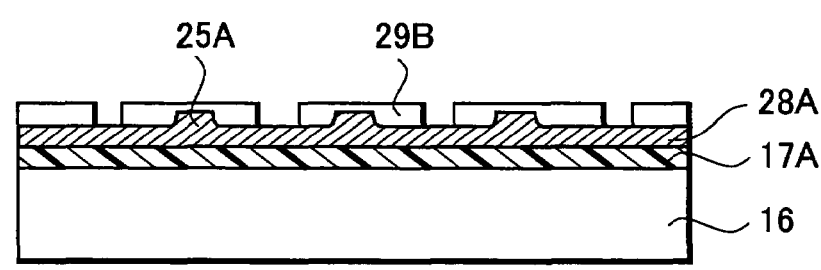
Figure 6C:
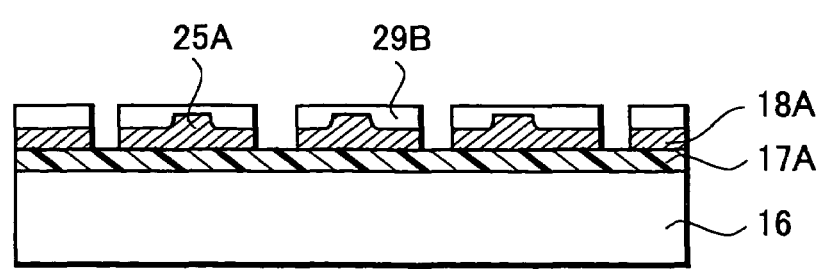

With reference to FIG. 6A, next, the first conductive film 28A including an upper surface of the first connection part 25A is covered with a resist 29B. Moreover, with reference to FIG. 6B, after patterning the resist 29B in accordance with the first wiring layer 18A to be formed, etching is performed. Thus, patterning of the first conductive film 28A is performed. FIG. 6C shows the state after etching is performed. After etching of the first wiring layer 18A is finished, the resist 29B is removed.

Figure 7A:
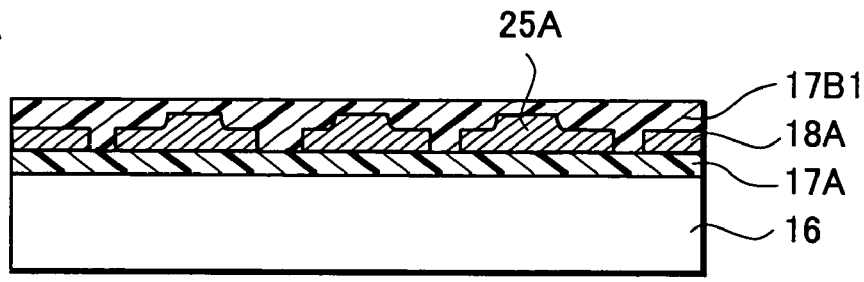
FIGS. 7A to 7C are cross-sectional views showing the method for manufacturing a hybrid integrated circuit device of the preferred embodiment of the invention.
Figure 7B:
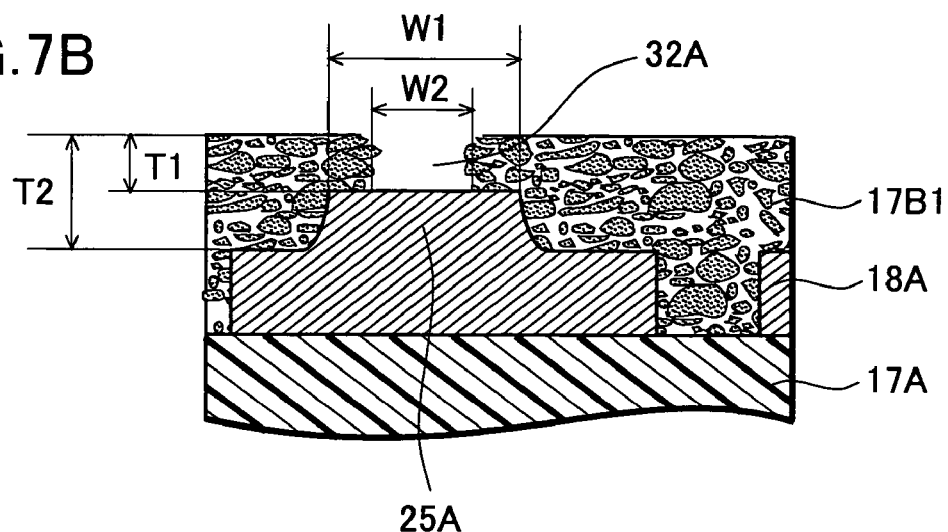
Figure 7C:
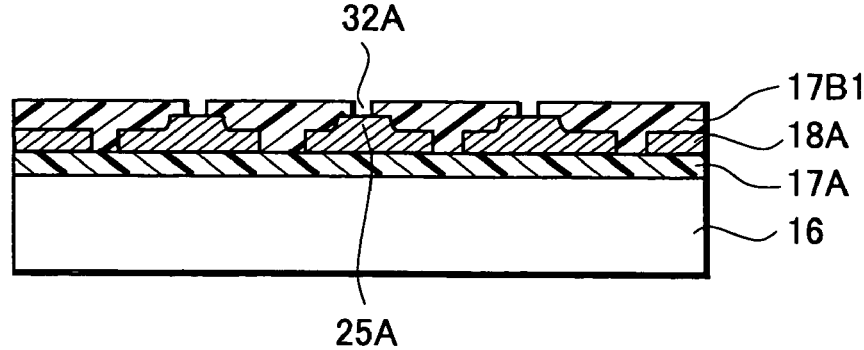

With reference to FIGS. 7A to 7C, next, a first throughhole 32A is formed after the first wiring layer 18A is covered with a first resin film 17B 1.

With reference to FIG. 7A, the first wiring layer 18A is covered with the first resin film 17B1. Here, the first resin film 17B1 is formed so as to also cover the upper surface of the first connection part 25A protruded upward. As a material of the first resin film 17B1, one obtained by mixing inorganic fillers in an insulating resin such as an epoxy resin is used. An amount of the inorganic fillers mixed in can be changed between about 30 wt % to 80 wt %. Moreover, in order to improve heat release properties, relatively large fillers having a particle size of about 30 μm may be contained in the first resin film 17B1.

With reference to FIG. 7B, next, by use of a removal method such as a laser, the first resin film 17B1 which covers the first connection part 25A is partially removed. In this embodiment, by providing the first connection part 25A, the first resin film 17B1 is partially thinned. Thereafter, a region of the first resin film 17B1 which is thinned is removed by use of a laser, and the first connection part 25A is exposed in a bottom of the first through-hole 32A. In most regions, a thickness T2 of the first resin film 17B1 is, for example, about 50 μm. Meanwhile, in the region where the first through-hole 32A is formed, a thickness T1 of the first resin film 17B 1 is, for example, as thin as about 10 μm to 25 μm.

Therefore, if it is assumed that the first through-hole 32A having the same aspect ratio is formed by use of the laser, it is possible to form the first through-hole 32A having a small diameter according to this embodiment. In the case of thickness conditions as described above, the diameter of the first through-hole 32A can be reduced to about half. Thus, an area occupied by the first through-hole 32A can be reduced to about ¼. This contributes to miniaturization of the entire device. Moreover, since the inorganic fillers are mixed in the first resin film 17B1 in order to secure heat release properties, formation of the first through-hole 32A by use of the laser is in a difficult situation. In order to form the first through-hole 32A in such a situation, it is useful to reduce the thickness of the first resin film 17B1 in the region where the first through-hole 32A is formed.

A planar size of the first connection part 25A is set to be larger than that of the first through-hole 32A formed thereabove. In other words, since planar shapes of the first through-hole 32A and the first connection part 25A are circles, the diameter of the first connection part 25A is set to be larger than that of the first through-hole 32A. For example, if a diameter W2 of the first through-hole 32A is about 100 μm, a diameter W1 of the first connection part 25A is about 150 μm to 200 μm. Moreover, if the diameter W2 of the first through-hole 32A is about 30 μm to 50 μm, the diameter W1 of the first connection part 25A is adjusted to about 50 μm to 70 μm. As described above, the planar size of the first connection part 25A is set to be larger than that of the first through-hole 32A. Accordingly, even if the first through-hole 32A is formed with some positional shift, the first through-hole 32A can be positioned above the first connection part 25A. Therefore, it is possible to prevent lowering of connection reliability attributable to the positional shift described above. Moreover, as the planar shape of the first connection part 25A, shapes other than the circle can be adopted.

FIG. 7C shows a state of the circuit board 16 after the first through-hole 32A is formed. Here, above each of the first connection parts 25A, the first through-hole 32A is formed. In the bottom of each of the first through-holes 32A, the upper surface of the first connection part 25A is exposed.

Figure 8A:
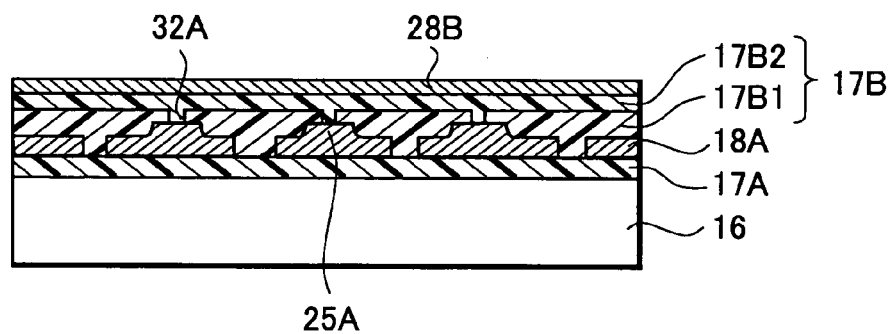
FIGS. 8A to 8C are cross-sectional views showing the method for manufacturing a hybrid integrated circuit device of the preferred embodiment of the invention.

With reference to FIG. 8A, next, a second resin film 17B2 is formed on the first resin film 17B1, and a second conductive film 28B is laminated on the second resin film 17B2. To be more specific, the second resin film 17B2 is formed so as to cover the surface of the first resin film 17B1 and to fill up the first through-hole 32A. The first and second resin films 17B1 and 17B2 form a second insulating layer 17B positioned between a respective wiring layers 18.

As a material of the second resin film 17B2, a resin having inorganic fillers for heat release mixed therein or a resin having no inorganic fillers mixed therein is adopted. By adopting the resin having no inorganic fillers mixed therein as the second resin film 17B2, formation of a second through-hole 32B described below is facilitated. Moreover, a side face of the second through-hole 32B is made relatively smooth. Thus, formation of a plated film by electroless processing can be facilitated. Furthermore, even if the inorganic fillers are mixed in the second resin film 17B2, it is preferable to set an amount thereof to be smaller than that in the first resin film 17B1. Furthermore, an average particle diameter of the inorganic fillers contained in the second resin film 17B2 is preferably smaller than that of the inorganic fillers contained in the first resin film 17B1. Thus, the second through-hole 32B can be easily provided in a subsequent step. Furthermore, since irregularities on a sidewall of the second through-hole 32B can be reduced, a plated film can be surely formed by use of an electrolytic plating method.

Figure 8B:
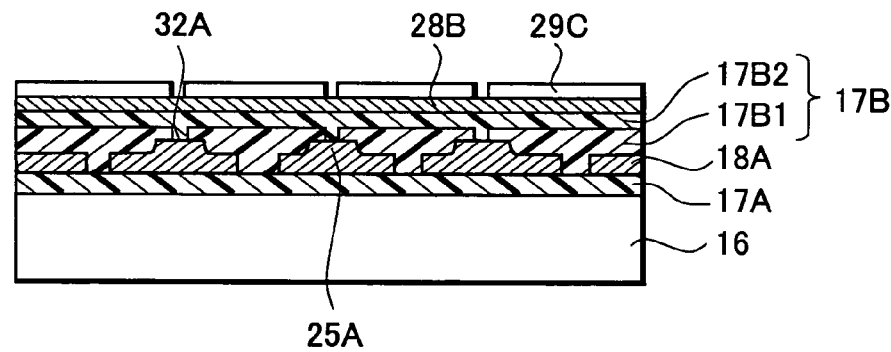
Figure 8C:
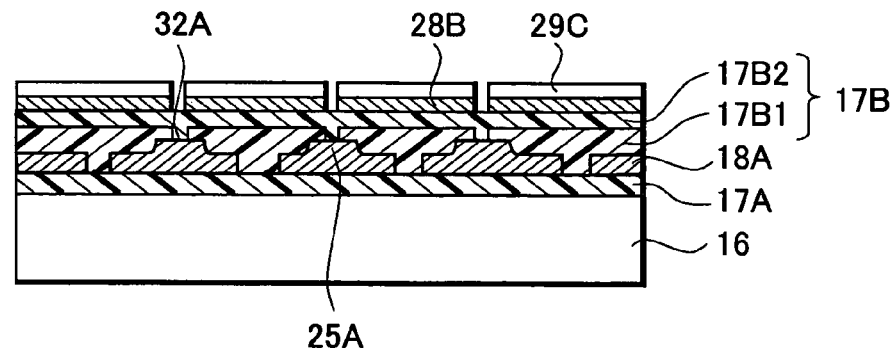

With reference to FIGS. 8B and 8C, next, a resist 29C is selectively formed on the second conductive film 28B except for a spot corresponding to the first connection part 25A. Moreover, by etching, the second conductive film 28B exposed from the resist 29C is removed.

Figure 9A:
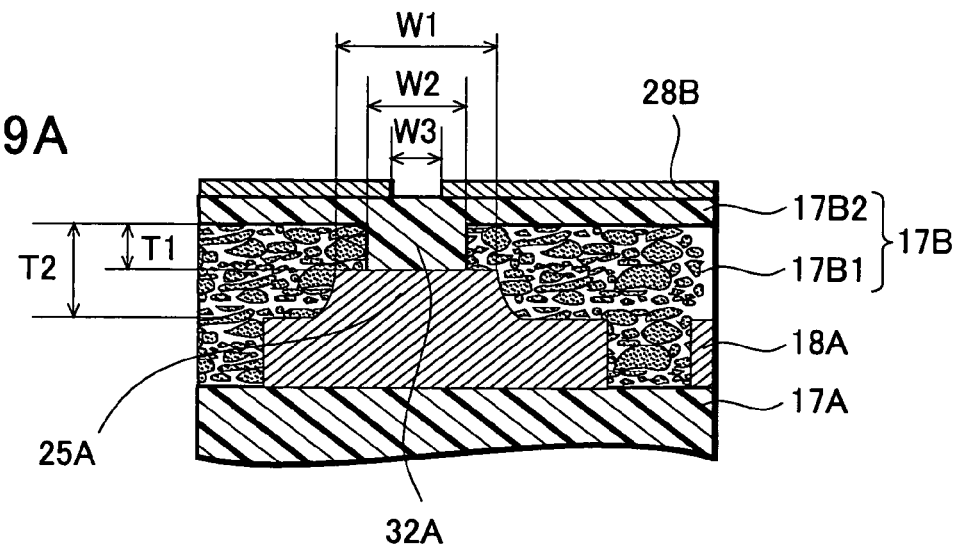
FIGS. 9A to 9C are cross-sectional views showing the method for manufacturing a hybrid integrated circuit device of the preferred embodiment of the invention.

With reference to FIG. 9A, by selectively removing the second conductive film 28B by etching described above, the upper surface of the second resin film 17B2 buried in the first through-hole 32A is exposed to the outside. In the case where a width of an opening in the second conductive film 28B is W3, this width W3 is set to be narrower than the width W2 of the first through-hole 32A. Moreover, the opening of the second conductive film 28B is formed inside the region of the first through-hole 32A. Thus, the second through-hole 32B formed by irradiating a laser from above can be formed to be smaller than the first through-hole 32A. Furthermore, the second through-hole 32B can be formed inside the first through-hole 32A.

Figure 9B:
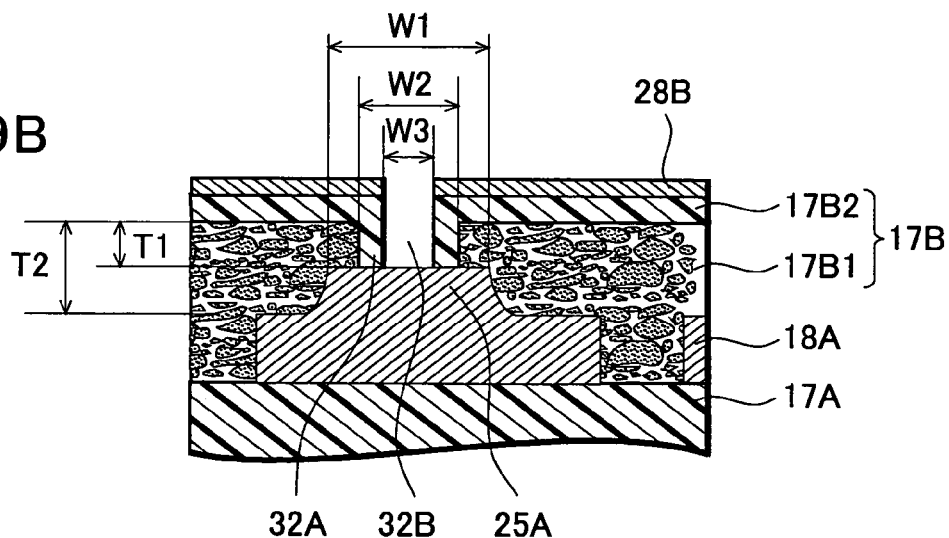

With reference to FIG. 9B, next, the second resin film 17B2 exposed from the second conductive film 28B is removed by irradiating a laser. The second resin film 17B2 has fewer inorganic fillers contained, compared to the first resin film 17B1. Alternatively, the second resin film 17B2 has no inorganic fillers mixed therein. Therefore, the second through-hole 32B can be easily formed by irradiating the laser. Furthermore, since a sidewall of the second through-hole 32B formed has a relatively smooth surface, a plated film is easily formed by electroless plating.

Figure 9C:
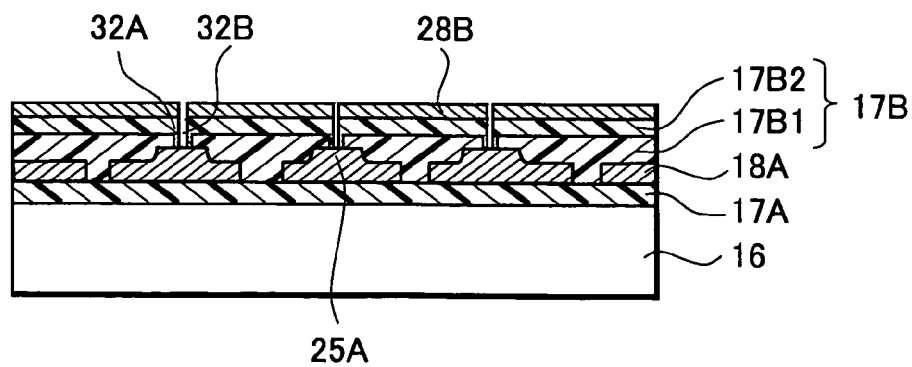

FIG. 9C shows a state after the second through-hole 32B is formed by the step described above. The first and second through-holes 32A and 32B are formed above each of the first connection parts 25A.

Note that, in the above description, the second resin film 17B2 is formed so as to cover the surface of the first resin film 17B1 and to fill up the first through-hole 32A. However, it is also possible to fill only inside of the first through-hole 32A with an insulating resin. In this case, the first through-hole 32A is filled with a resin material having the same composition as that of the second resin film 17B2. Thereafter, the second through-hole 32B is formed in this resin material.

Moreover, in order to perform plating processing in the next step, zincate processing is performed as preparation. Here, the zincate processing is one which facilitates the plating processing by performing electroless plating by use of an alkaline solution containing Zn ions. The inorganic fillers may be exposed on the sidewall of the second through-hole 32B. Adhesion strength between the inorganic fillers and the plated film is considered to be weak. Accordingly, by performing the zincate processing, formation of the plated film by electroless processing of the exposed inorganic fillers can be facilitated.

With reference to FIGS. 10 and 11, next, a description will be given of the step of forming a second connection part 25B by forming a plated film in the second through-hole 32B and of connecting the first wiring layer 18A to the second conductive film 28B. Here, the first and second connection parts 25A and 25B form a connection part 25. Accordingly, the wiring layers are connected to each other in a desired spot by use of the connection part 25. There are considered two methods for forming the plated film to be the second connection part 25B. The first method is a method for forming a plated film by electroless plating and, thereafter, forming a plated film again by electrolytic plating. The second method is a method for forming a plated film only by electrolytic plating.

Figure 10A:
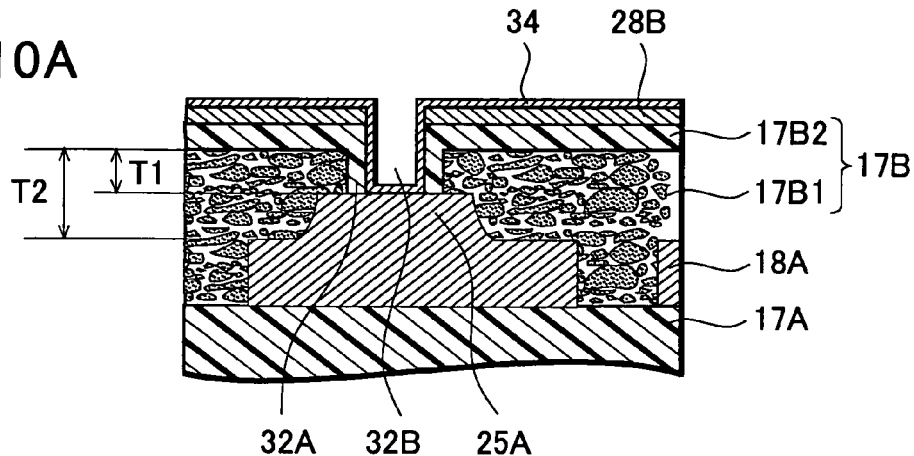
FIGS. 10A to 10C are cross-sectional views showing the method for manufacturing a hybrid integrated circuit device of the preferred embodiment of the invention.
Figure 10B:
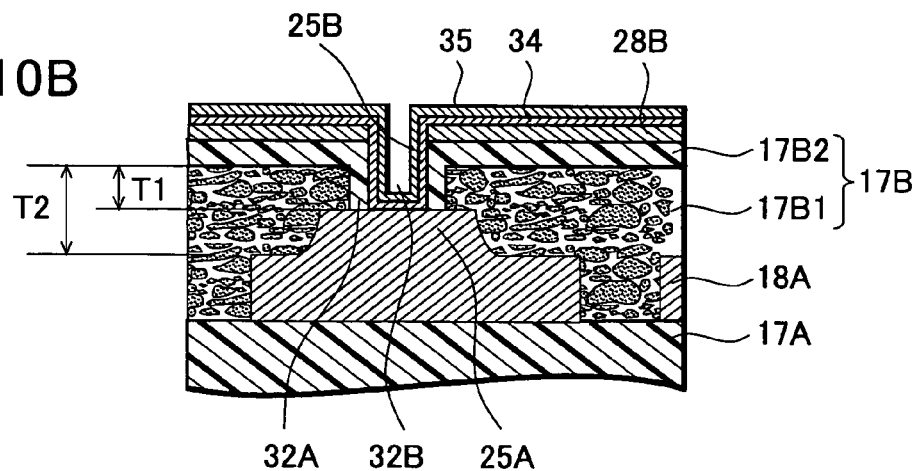
Figure 10C:
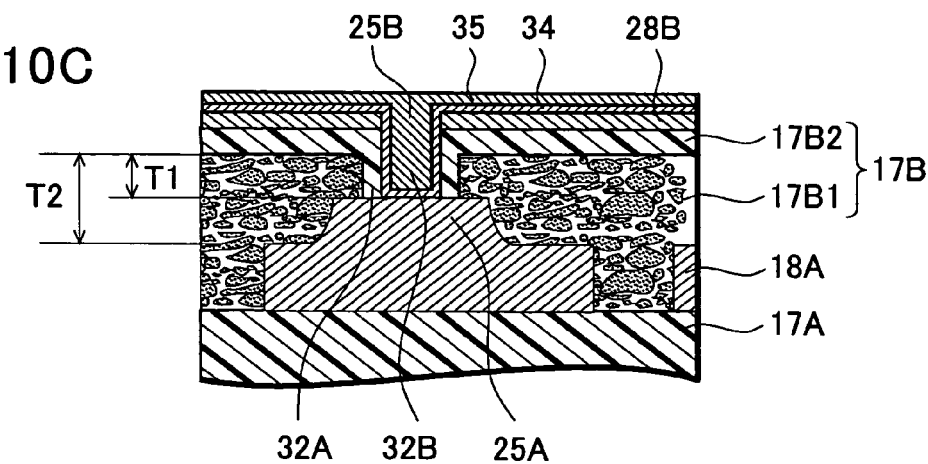

With reference to FIGS. 10A to 10C, the foregoing first method for forming a plated film will be described. First, with reference to FIG. 10A, a plated film 34 is formed by electroless plating on the surface of the second conductive film 28B including the sidewall of the second through-hole 32B. A thickness of the plated film 34 may be about 3 μm to 5 μm. As described above, the sidewall of the second through-hole 32B formed in the second resin film 17B2 containing fewer fillers is in a state where a plated film is easily formed by electroless processing.

Next, with reference to FIG. 10B, a new plated film 35 is formed on the plated film 34 by electrolytic plating. To be more specific, by use of the second conductive film 28B having the plated film 34 formed thereon as a cathode electrode, the plated film 35 is formed by electrolytic plating. By use of the electroless plating described above, the plated film 34 is formed on the inner wall of the second through-hole 32B. Therefore, the plated film 35 formed here is formed to have a uniform thickness including the inner wall of the second through-hole 32B. Thus, the second connection part 25B formed of the plated film is formed. Specifically, a thickness of the plated film 35 is, for example, about 20 μm. As a material of the plated films 34 and 35 described above, copper that is the same material as that of the second conductive film 28B can be used. Moreover, metal other than copper can be used as the material of the plated films 34 and 35.

With reference to FIG. 10C, here, filling plating is performed to fill the second through-hole 32B with the plated film 35. By performing the filling plating, mechanical strength of the second connection part 25B can be improved.

Next, with reference to FIGS. 11A and 11B, a description will be given of a method for forming the second connection part 25B by use of electrolytic plating.

Figure 11A:
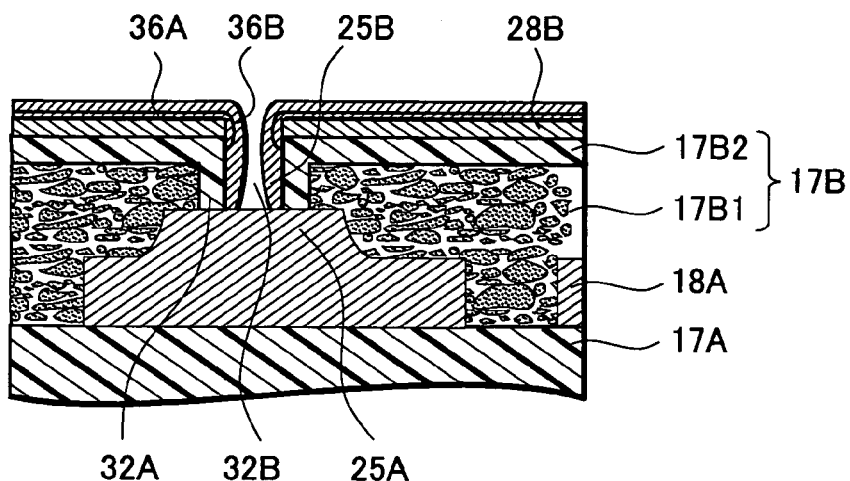
FIGS. 11A and 11B are cross-sectional views showing the method for manufacturing a hybrid integrated circuit device of the preferred embodiment of the invention.

With reference to FIG. 11A, first, a solution containing metal ions is allowed to come into contact with the second through-hole 32B. Here, as a material of a plated film, copper, gold, silver, palladium or the like can be used. When a current is allowed to flow by use of the second conductive film 28B as the cathode electrode, metal is deposited on the second conductive film 28B that is the cathode electrode, and a plated film is formed. Here, reference numerals 36A and 36B indicate a state where the plated film is grown. By use of electrolytic plating, a plated film is preferentially formed in a spot with a strong electric field. In this embodiment, this electric field becomes stronger in the second conductive film 28B facing a peripheral portion of the second through-hole 32B. Therefore, as shown in FIG. 11A, the plated film is preferentially grown from the second conductive film 28B facing the peripheral portion of the second through-hole 32B. At the point when the formed plated film comes into contact with the first connection part 25A, the first wiring layer 18A and the second conductive film 28B are connected to each other. Thereafter, a plated film is formed uniformly inside the second through-hole 32B. Thus, inside the second through-hole 32B, the second connection part 25B integrated with the second conductive film 28B is formed.

Figure 11B:
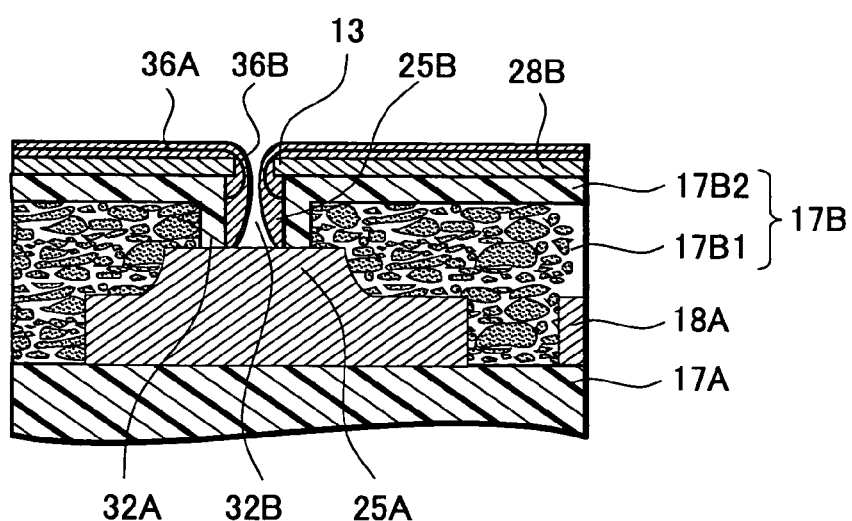

With reference to FIG. 11B, next, a description will be given of another method for forming the second connection part 25B. Here, a canopy top 13 is provided in a peripheral portion of the second through-hole 32B. Thus, the second connection part 25B is easily formed by electrolytic plating. Here, the "canopy top" means a part which is formed of the second conductive film 28B and is protruded so as to cover the peripheral portion of the second through-hole 32B. A specific method for forming the canopy top 13 can be performed by increasing output of a laser when the second through-hole 32B is formed by use of the laser. By increasing the output of the laser, removal of the second resin film 17B2 by use of the laser is advanced horizontally, and the resin below the canopy top 13 is removed. Under the conditions described above, electrolytic plating is performed by use of the second conductive film 28B as the cathode electrode. Accordingly, the plated film is grown preferentially from the canopy top 13. Since the plated film is grown from the canopy top 13, the plated film can be grown preferentially downward compared to the case of FIG. 11A. Therefore, it is possible to surely fill the second through-hole 32B with the plated film. The formation of the plated film by use of the electrolytic plating described above can be performed even if the conditions for forming the plated film are poor since the inorganic filers are exposed on the sidewall of the second through-hole 32B.

In this embodiment, by forming a plated film on the second through-hole 32B, a plated film is inevitably formed on the surface of the second conductive film 28B, and a thickness thereof is increased. However, in this embodiment, since the plated film is formed on the second through-hole 32B which is as shallow as about 10 μm as described above, a total thickness of the plated films formed can be reduced. Therefore, since there is a small increase in the thickness of the second conductive film 28B due to adhesion of the plated film, the second conductive film 28B can be maintained to be thin. Thus, a second wiring layer 18B formed of the second conductive film 28B can be made minute.

Furthermore, also in the case where the through-hole 32 is filled up by filling plating, since the through-hole 32 is formed to be shallow as described above, filling plating can be easily performed.

Figure 12A:
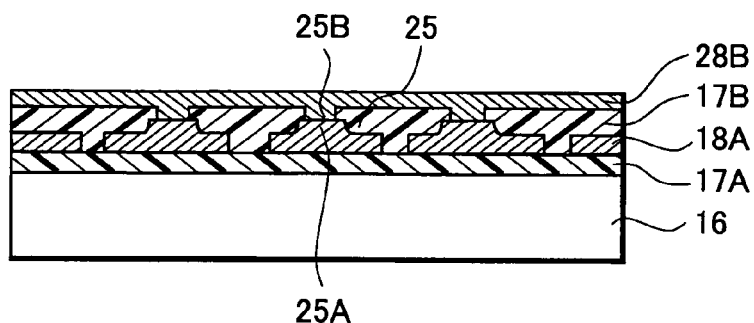
FIGS. 12A to 12C are cross-sectional views showing the method for manufacturing a hybrid integrated circuit device of the preferred embodiment of the invention.
Figure 12B:
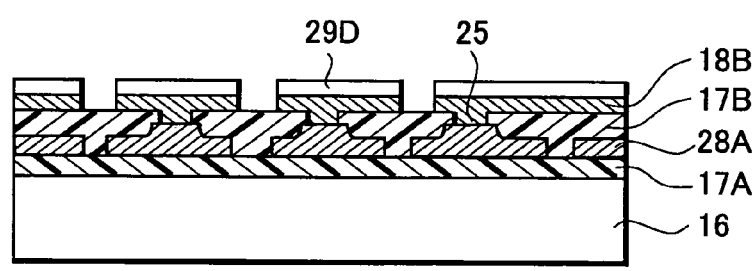
Figure 12C:
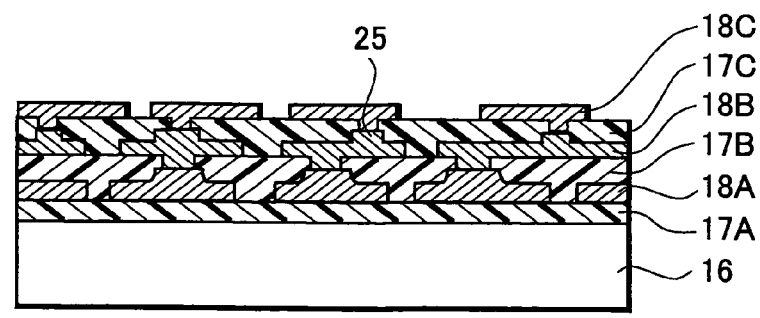

With reference to FIG. 12A, by forming the second connection part 25B, the connection part 25 including the first and second connection parts 25A and 25B is formed. Moreover, with reference to FIG. 12B, by performing selective etching using a resist 29D, the second wiring layer 18B is formed. Furthermore, with reference to FIG. 12C, here, a three-layer wiring structure including the first to third wiring layers 18A to 18C is formed. In this case, convex-shaped parts, which form the connection part 25, are formed on both upper and lower surfaces of the second wiring layer 18B.

Figure 13A:
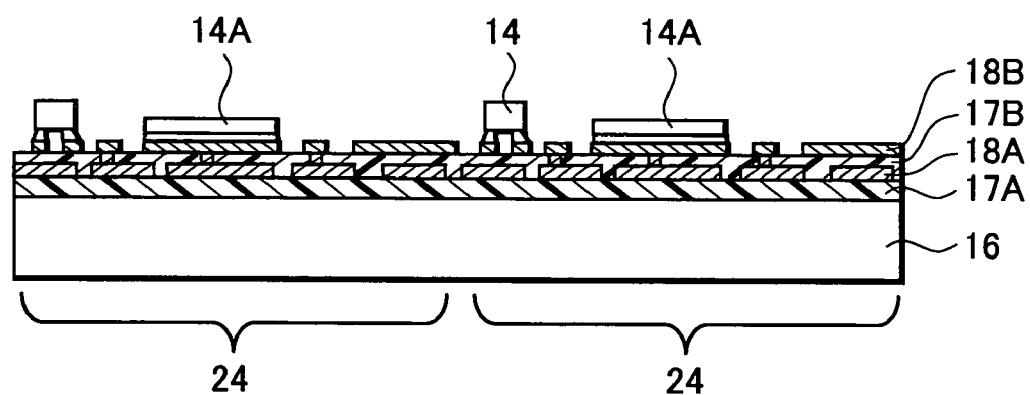
FIGS. 13A and 13B are cross-sectional views showing the method for manufacturing a hybrid integrated circuit device of the preferred embodiment of the invention.
Figure 13B:
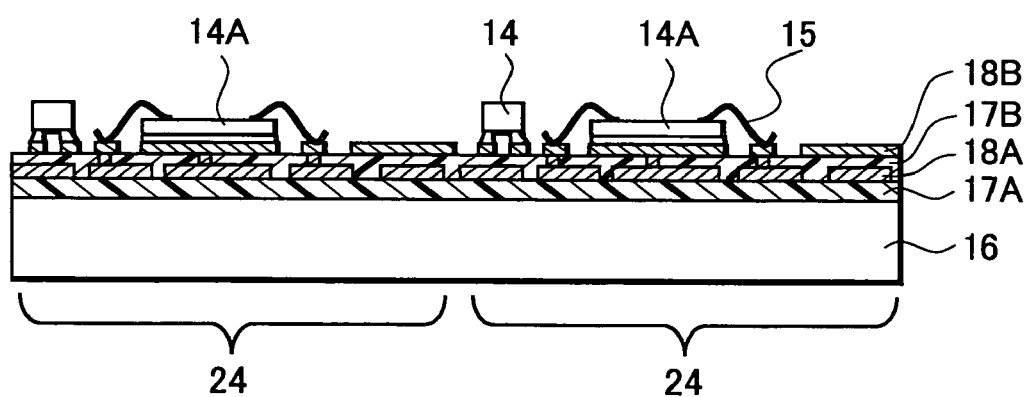

With reference to FIG. 13A, next, the circuit element 14 is fixed onto the second wiring layer 18B (island) by use of solder, a conductive paste or the like. The semiconductor element 14A is mounted face up or face down. Moreover, with reference to FIG. 13B, the semiconductor element 14A and the second wiring layer 18B are electrically connected to each other through thin metal wires 15.

After the foregoing steps are finished, respective units 24 are separated. The respective units 24 can be separated by punching using a press machine, dicing, bending or the like. Thereafter, the leads 11 are fixed to the circuit board 16 of the each unit 24.

Figure 14:
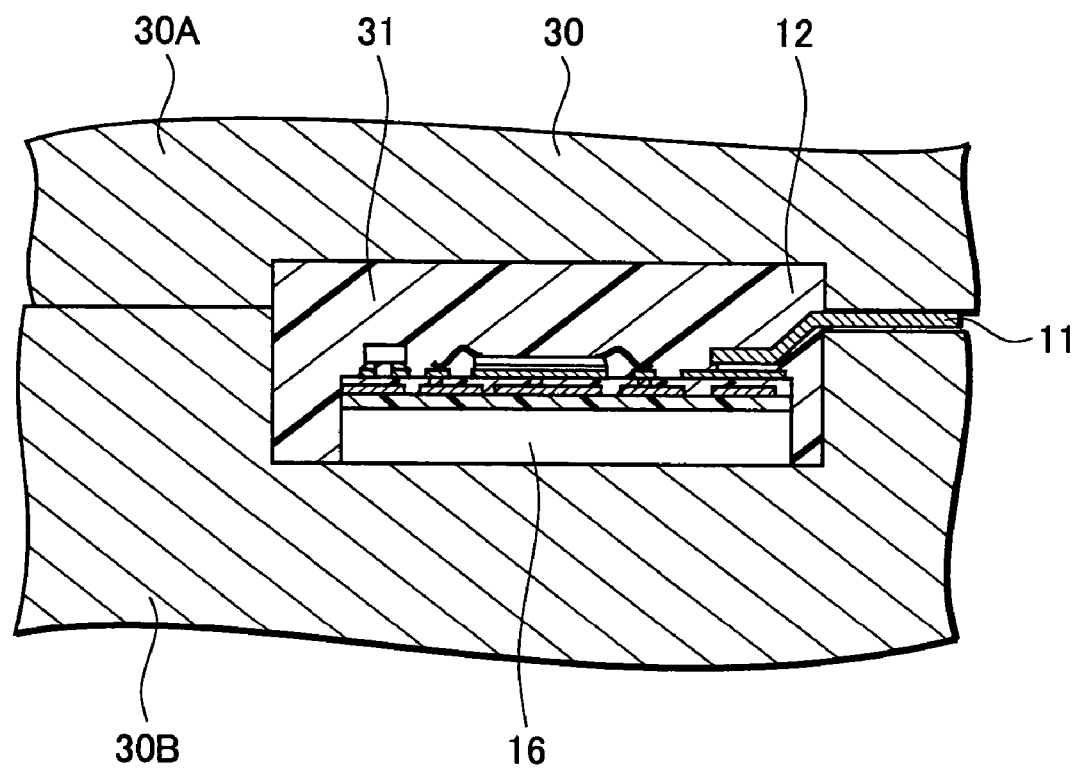
FIG. 14 is a cross-sectional view showing the method for manufacturing a hybrid integrated circuit device of the preferred embodiment of the invention.
Figure 15A:
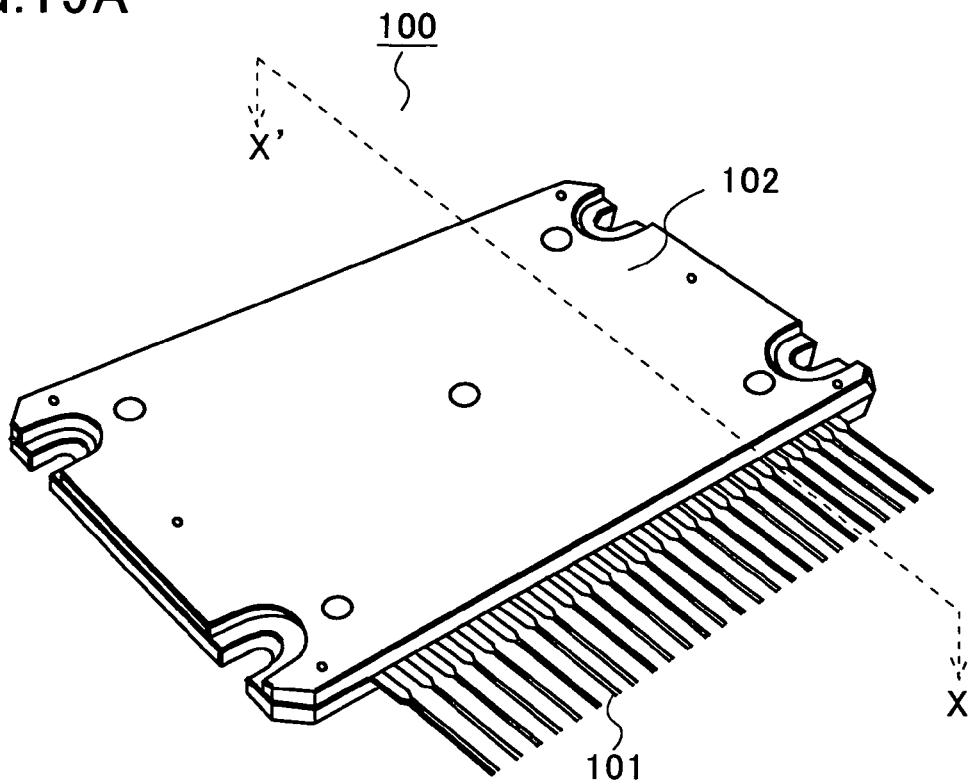
FIG. 15A is a perspective view and FIG. 15B is a cross-sectional view showing a conventional hybrid integrated circuit device.
Figure 15B:
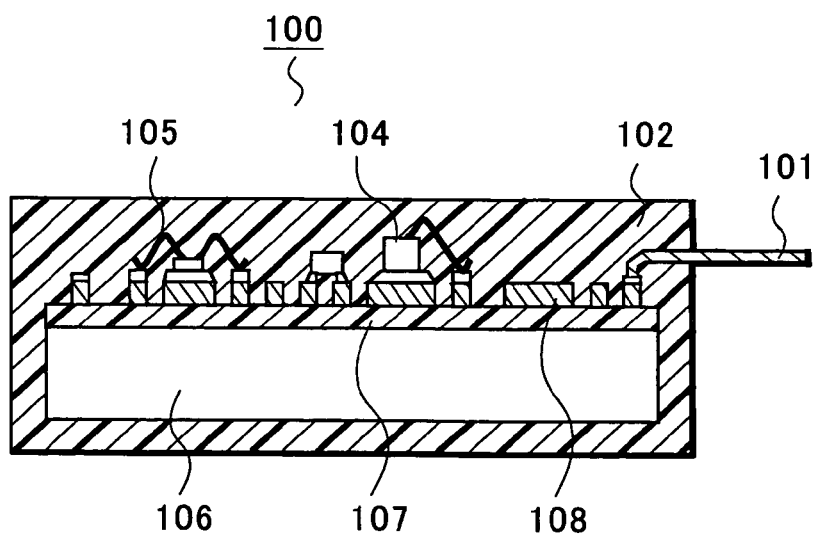

With reference to FIG. 14, next, plastic molding of each circuit board 16 is performed. Here, sealing is performed by transfer molding using a thermosetting resin. Specifically, after the circuit board 16 is housed in a mold 30 formed of an upper mold 30A and a lower mold 30B, the both molds are engaged with each other to fix the leads 11. Subsequently, a resin is injected into a cavity 31, and a plastic molding step is performed. By the steps described above, the hybrid integrated circuit device having the structure shown in FIGS. 1A to 1C, for example, is manufactured.

What is claimed is:

1. A circuit device comprising:
   a plurality of wiring layers which are laminated with an insulating layer containing fillers interposed therebetween; and
   a connection part which penetrates the insulating layer in a thickness direction thereof, and electrically connects the wiring layers to each other in a desired spot,
   wherein the connection part is provided inside an insulating resin which covers a sidewall of a through-hole provided in the insulating layer, and
   the insulating resin contains fewer fillers than the insulating layer.

2. The circuit device according to claim 1, wherein
   the first connection part which is partially protruded in the thickness direction is provided in the wiring layer, and
   the through-hole is provided in the insulating layer in a region which is thinned by burying the first connection part.

3. The circuit device according to claim 1, wherein an average particle diameter of the fillers contained in the insulating resin is smaller than that of the fillers contained in the insulating layer.

4. A circuit device comprising:
   a plurality of wiring layers laminated with an insulating layer containing fillers interposed therebetween,
   wherein the wiring layers are electrically connected to each other in a desired spot through a connection part which penetrates the insulating layer in a thickness direction thereof,
   the insulating layer is formed of a first resin film containing the fillers, and a second resin film which is laminated on the first resin film and contains fewer fillers than the first resin film, and
   a through-hole which penetrates the first resin film in a thickness direction thereof is provided, and the connection part is provided inside the second resin film which covers a sidewall of the through-hole.

5. The circuit device according to claim 4, wherein
   the first connection part which is partially protruded in the thickness direction is provided in the wiring layer, and
   the through-hole is provided in the insulating layer in a region which is thinned by burying the first connection part.

6. The circuit device according to claim 4, wherein an average particle diameter of the fillers contained in the second resin film is smaller than that of the fillers contained in the first resin film.

7. A method for manufacturing a circuit device, by which a plurality of wiring layers are laminated with an insulating layer containing fillers interposed therebetween, comprising:
   forming a first through-hole which penetrates the insulating layer in a thickness direction thereof;
   burying an insulating resin, which contains the fewer fillers than the insulating layer, in the first through-hole;
   forming a second through-hole, which has a planar size smaller than that of the first through-hole, in the insulating resin; and
   providing a connection part which connects the wiring layers to each other in the second through-hole.

8. The method for manufacturing a circuit device according to claim 7, wherein an average particle diameter of the fillers contained in the insulating resin is smaller than that of the fillers contained in the insulating layer.

9. The method for manufacturing a circuit device according to claim 7, wherein the first and second through-holes are formed by irradiating a laser.

10. The method for manufacturing a circuit device according to claim 7, wherein the connection part is formed by forming a plated film on the second through-hole.

11. The method for manufacturing a circuit device according to claim 7, wherein the first and second through-holes are provided in the insulating layer in a region which is thinned by partially thickening the wiring layer.

12. A method for manufacturing a circuit device, comprising:
   forming a first wiring layer on a surface of a circuit board;
   providing a first resin film having fillers mixed therein on the surface of the circuit board so as to cover the first wiring layer;
   forming a first through-hole which penetrates the first resin film in a thickness direction thereof, and exposing the first wiring layer from a bottom of the first through-hole;
   forming a second resin film, which contains the fewer fillers than the first resin film, on a surface of the first resin film so as to be buried in the first through-hole;
   laminating a second conductive film on a surface of the second resin film;
   forming a second through-hole smaller than the first through-hole by removing the second resin film buried in the first through-hole and the second conductive film thereabove, and exposing the first wiring layer from a bottom of the first through-hole;
   providing a connection part which connects the first wiring layer to the second conductive film in the second through-hole; and
   forming a second wiring layer by patterning the second conductive film.

13. The method for manufacturing a circuit device according to claim 12, wherein an average particle diameter of the fillers contained in the second resin film is smaller than that of the fillers contained in the first resin film.

14. The method for manufacturing a circuit device according to claim 12, wherein the first and second through-holes are formed by irradiating a laser.

15. The method for manufacturing a circuit device according to claim 12, wherein the connection part is formed by forming a plated film on the second through-hole.

16. The method for manufacturing a circuit device according to claim 12, wherein the first and second through-holes are formed so as to expose an upper surface of the first wiring layer which is formed to be partially thick.

* * * * *